(12) United States Patent
Nishioka et al.

(10) Patent No.: US 10,916,489 B1
(45) Date of Patent: Feb. 9, 2021

(54) MEMORY CORE CHIP HAVING TSVS

(71) Applicant: MICRON TECHNOLOGY, INC., Boise, ID (US)

(72) Inventors: Naohisa Nishioka, Sagamihara (JP); Seiji Narui, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/590,760

(22) Filed: Oct. 2, 2019

(51) Int. Cl.
| G11C 5/06 | (2006.01) |
| H01L 23/48 | (2006.01) |
| G11C 29/44 | (2006.01) |
| G11C 7/10 | (2006.01) |

(52) U.S. Cl.
CPC ............ *H01L 23/481* (2013.01); *G11C 5/06* (2013.01); *G11C 7/1051* (2013.01); *G11C 29/4401* (2013.01)

(58) Field of Classification Search
CPC ............ G11C 11/4096; G11C 11/4087; G11C 11/4093; G11C 7/1057; G11C 7/1084; G11C 11/4074; G11C 11/4076; G11C 2207/107; G11C 5/02; G11C 5/025; G11C 5/04; G11C 5/063; G11C 5/14; G11C 11/408; G11C 11/0496; G11C 7/10; G11C 7/00; H01L 2924/00014; H01L 2924/013; H01L 2924/0105; H01L 2924/01049; H01L 2924/00012; H01L 2924/01079; H01L 2224/13111; H01L 2924/01022; H01L 2924/01082; H01L 2924/014; H01L 2924/00; H01L 2924/01041

USPC ........... 365/189.011, 189.03, 189.17; 257/E21.022, E29.001, 531, 777
See application file for complete search history.

(56) References Cited

U.S. PATENT DOCUMENTS

| 9,401,312 B1 | 7/2016 | Kannan et al. |
| 2012/0069685 A1 | 3/2012 | Ide et al. |
| 2012/0105093 A1 | 5/2012 | Lee |
| 2012/0114086 A1 | 5/2012 | Hayashi |
| 2013/0082404 A1* | 4/2013 | Kajigaya ............ H01L 23/498 257/777 |
| 2013/0230932 A1 | 9/2013 | Bringivijayaraghavan et al. |
| 2015/0206825 A1 | 7/2015 | Park |
| 2015/0262648 A1 | 9/2015 | Nishioka et al. |
| 2015/0363258 A1 | 12/2015 | Shin et al. |
| 2017/0110169 A1 | 4/2017 | Kim et al. |
| 2017/0110206 A1 | 4/2017 | Ryu et al. |
| 2017/0154655 A1 | 6/2017 | Seo |

(Continued)

OTHER PUBLICATIONS

U.S. Appl. No. 16/576,647 titled "TSV Check Circuit With Replica Path" filed Sep. 19, 2019.

(Continued)

*Primary Examiner* — Thong Q Le
(74) *Attorney, Agent, or Firm* — Dorsey & Whitney LLP (57) ABSTRACT

Disclosed herein is an apparatus that includes a memory cell array, a plurality of TSVs penetrating a semiconductor chip, an output circuit configured to output a data to the TSVs, an input circuit configured to receive a data from the TSVs, a pad supplied with a data from outside, and a control circuit configured to write the data to the memory cell array, read the data from the memory cell array, and transfer the data from the memory cell array to the input circuit via the output circuit and the TSVs.

20 Claims, 12 Drawing Sheets

(56) References Cited

U.S. PATENT DOCUMENTS

| | | |
|---|---|---|
| 2017/0227605 A1 | 8/2017 | Kim et al. |
| 2017/0301667 A1 | 10/2017 | Or-bach et al. |
| 2018/0122686 A1 | 5/2018 | Or-bach et al. |
| 2018/0247876 A1 | 8/2018 | Kim et al. |
| 2018/0277216 A1 | 9/2018 | Inoue et al. |
| 2019/0067359 A1 | 2/2019 | Matsumoto |
| 2019/0362804 A1 | 11/2019 | Kim |
| 2020/0027521 A1 | 1/2020 | Choi |

OTHER PUBLICATIONS

U.S. Appl. No. 16/590,789 titled "TSV Auto Repair Scheme on Stacked Die" filed Oct. 2, 2019.

Chou, Yung-Fa et al., "Reactivation of Spares for Off-Chip Memory Repair After Die Stacking in a 3-D IC With TSVs", IEEE Transactions on Circuits and Systems I: Regular Papers, vol. 60, No. 9, Sep. 2013, pp. 2343-2351.

Lee, Changwook et al., "A New Fuse Architecture and a New Post-Share Redundancy Scheme for Yield Enhancement in 3-D Stacked Memories", IEEE Transactions on Computer-Aided Design of Integrated Circuits and Systems, vol. 33, No. 5, May 2014, pp. 786-797.

\* cited by examiner

| Memory core chip | Channel | SID | DW |
|---|---|---|---|
| 27 | B,D,F,H | 1 | 1,3 |
| 26 | B,D,F,H | 0 | 1,3 |
| 25 | B,D,F,H | 1 | 0,2 |
| 24 | B,D,F,H | 0 | 0,2 |
| 23 | A,C,E,G | 1 | 1,3 |
| 22 | A,C,E,G | 0 | 1,3 |
| 21 | A,C,E,G | 1 | 0,2 |
| 20 | A,C,E,G | 0 | 0,2 |

|    | A     | B     | C     | D     | E     | F     | G     | H     |
|----|-------|-------|-------|-------|-------|-------|-------|-------|
| 10 | DM0R  | DM0F  | DM1R  | DM1F  | DM2R  | DM2F  | DM3R  | DM3F  |
| 9  | DQ0R  | DQ0F  | DQ8R  | DQ8F  | DQ16R | DQ16F | DQ24R | DQ24F |
| 8  | DQ1R  | DQ1F  | DQ9R  | DQ9F  | DQ17R | DQ17F | DQ25R | DQ25F |
| 7  | DQ2R  | DQ2F  | DQ10R | DQ10F | DQ18R | DQ18F | DQ26R | DQ26F |
| 6  | DQ3R  | DQ3F  | DQ11R | DQ11F | DQ19R | DQ19F | DQ27R | DQ27F |
| 5  | VDD   | VSS   | WCLKT | WCLKF | RCLKT | RCLKF | R2    | R1    |
| 4  | DQ4R  | DQ4F  | DQ12R | DQ12F | DQ20R | DQ20F | DQ28R | DQ28F |
| 3  | DQ5R  | DQ5F  | DQ13R | DQ13F | DQ21R | DQ21F | DQ29R | DQ29F |
| 2  | DQ6R  | DQ6F  | DQ14R | DQ14F | DQ22R | DQ22F | DQ30R | DQ30F |
| 1  | DQ7R  | DQ7F  | DQ15R | DQ15F | DQ23R | DQ23F | DQ31R | DQ31F |

MEMORY CORE CHIP HAVING TSVS

BACKGROUND

A semiconductor chip used in a memory device such as an HBM (High Bandwidth Memory) often includes many TSVs (Through Silicon Vias) provided to penetrate through a semiconductor substrate. The TSVs provided on each semiconductor chip are connected to TSVs provided on another semiconductor chip and located at same planar positions via bumps and pad electrodes, respectively, whereby signal paths penetrating through a plurality of semiconductor substrates are formed. In a case where a certain TSV is in a poor conduction state or there is poor connection at a connection point between two TSVs, the relevant signal path is defective and cannot be practically used. In this case, a spare signal path is used instead of the defective signal path to recover the defect.

Poor conduction of a TSV or poor connection at a connection point between two TSVs can be found only after a plurality of semiconductor chips are stacked. However, even if a defect is found on a signal path, it is difficult to determine whether this defect is caused by a defect of TSVs or a connection point between TSVs, or whether an input/output circuit connected to TSVs has a defect. Accordingly, a semiconductor device where an input/output circuit connected to TSVs can be tested before a plurality of semiconductor chips are stacked has been demanded.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
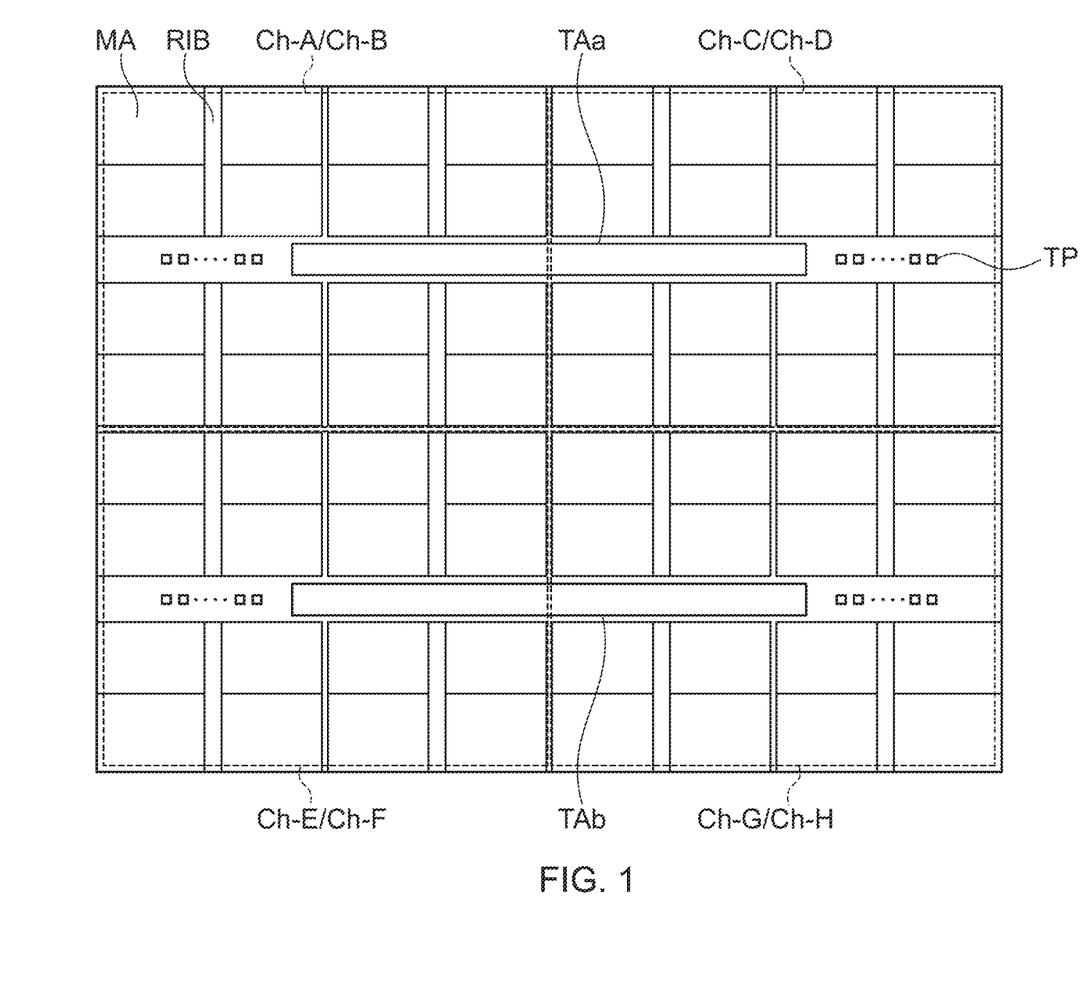
FIG. 1 is a schematic plan view showing a floor plan of a memory core chip according to the present disclosure.

As shown in FIG. 1, a memory core chip according to the present disclosure includes four channels, TSV areas TAa and TAb, and a test pad TP. The four channels are channels Ch-A, Ch-C, Ch-E, and Ch-G, or Ch-B, Ch-D, Ch-F, and Ch-H. Each of the channels includes a memory cell array MA in which many DRAM memory cells are arranged in an array, and a peripheral circuit RIB. The channels can operate independently of each other. Therefore, terminals such as a data input/output terminal, an address terminal, a command terminal, and a clock terminal are assigned to each of the channels. In the present embodiment, the number of I/O bits per channel is 144 bits, where 128 bits are real data and 16 bits are ECC (Error Correction Code) data. The TSV areas TAa and TAb are a region in which a plurality of TSVs provided to penetrate through a semiconductor substrate are arranged in an array. Although not particularly limited, the region is divided into the two TSV areas TAa and TAb in the memory core chip according to the present disclosure. The TSV area TAa is assigned to the channel Ch-A/Ch-B and the channel Ch-C/Ch-D and the other TSV area TAb is assigned to the channel Ch-E/Ch-F and the channel Ch-G/Ch-H. The test pad TP is used to input/output data such as a test data through probing in a wafer state. The test pad TP is formed on the surface of the semiconductor substrate without penetrating therethrough, unlike the TSVs. The planar size of the test pad TP is sufficiently greater than that of the TSVs to enable probing.

Figure 2:
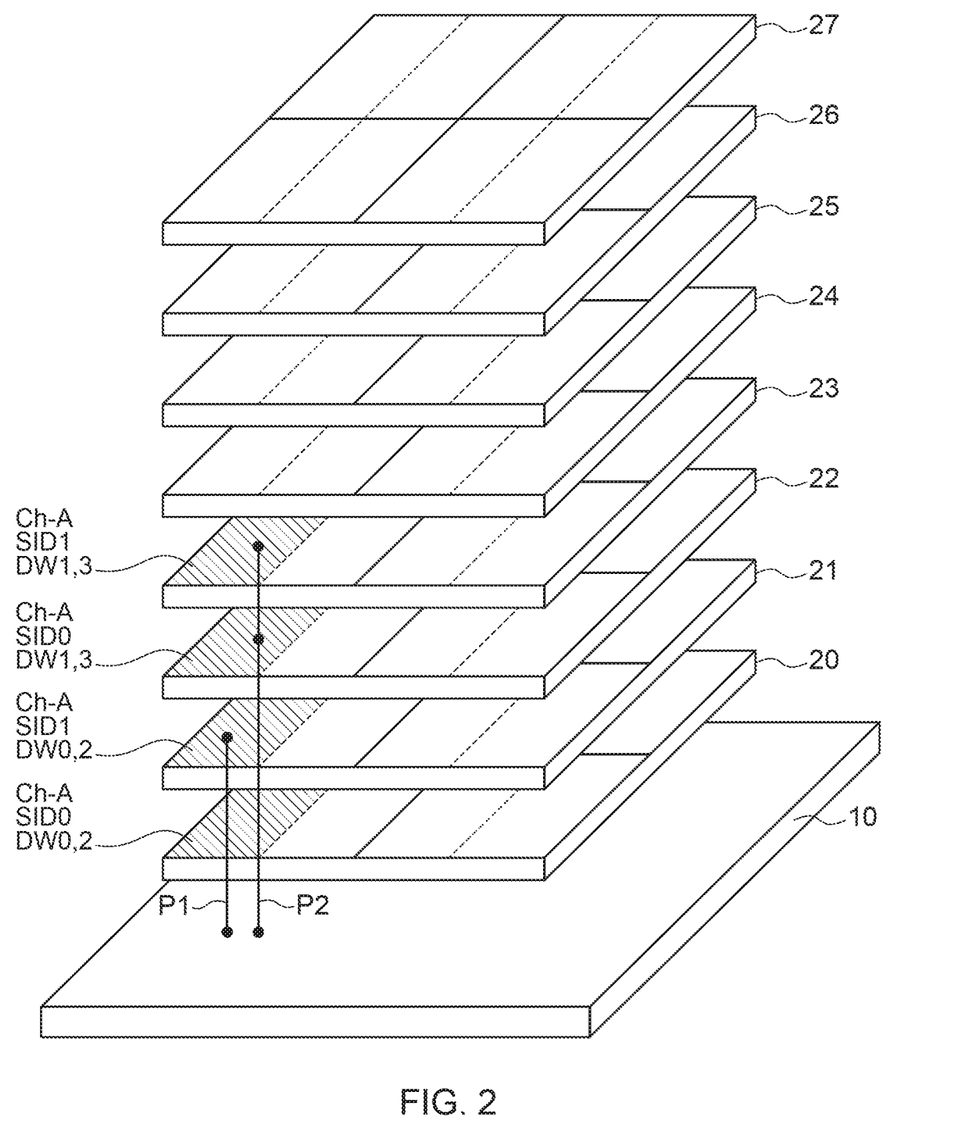
FIG. 2 is a schematic diagram showing a configuration of an HBM on which eight memory core chips according to the present disclosure are stacked one on top of another.
Figure 3:
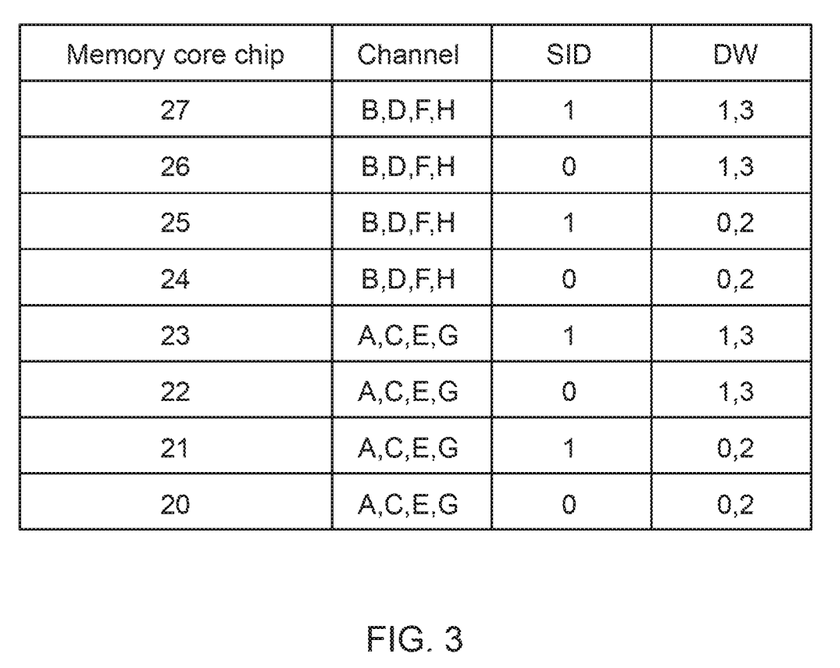
FIG. 3 is a table showing channels, slice addresses, and groups which are assigned to each of the memory core chips.

As shown in FIG. 2, a plurality of memory core chips according to the present disclosure are stacked one on top of another on an interface chip 10 to thereby form an HBM. The interface chip 10 is a semiconductor chip that controls the memory core chips. In an example shown in FIG. 2, the HBM has a configuration in which eight memory core chips 20 to 27 are stacked on the interface chip 10. Assignment of channels, slice addresses SID, and groups DW to each of the memory core chips 20 to 27 is as shown in FIG. 3. As shown in FIG. 3, the channel Ch-A, Ch-C, Ch-E, and Ch-G are assigned to the memory core chips 20 to 23, and the channel Ch-B, Ch-D, Ch-F, and Ch-H are assigned to the memory core chips 24 to 27. A most significant bit SID0 of the slice address is assigned to the memory core chips 20, 22, 24, and 26 and a most significant bit SID1 of the slice address is assigned to the memory core chips 21, 23, 25, and 27. The slice address SID is a selection signal of the memory core chips 20 to 27 and one of the most significant bits SID0 and SID1 of the slice address is activated at the time of a practical access. Therefore, the memory core chips 20, 22, 24, and 26 and the memory core chips 21, 23, 25, and 27 are mutually exclusively accessed. Groups DW0 and DW2 are assigned to the memory core chips 20, 21, 24, and 25 and groups DW1 and DW3 are assigned to the memory core chips 22, 23, 26, and 27. The groups DW0 to DW3 are obtained by dividing I/O data of 144 bits per channel into four parts. Therefore, the number of I/O bits per group is 36 bits, where 32 bits are real data and four bits are ECC data. With this configuration, a signal path through the TSVs is shared by two memory core chips. For example, focusing on the channel Ch-A, the memory core chips 20 and 22 are selected when the slice address SID0 is activated and the memory core chips 21 and 23 are selected when the slice address SID1 is activated. Because the same groups DW0 and DW2 are assigned to the memory core chip 20 and the memory core chip 21, a signal path P through the TSVs is assigned commonly to the memory core chip 20 and the memory core chip 21 and either one of these memory core chips is selected by the most significant bit SID of the slice address as shown in FIG. 2. Similarly, because the same groups DW1 and DW3 are assigned to the memory core chip 22 and the memory core chip 23, a signal path P2 through the TSVs is assigned commonly to the memory core chip 22 and the memory core chip 23 and either one thereof is selected by the most significant bit SID of the slice address as shown in FIG. 2.

Figure 4:
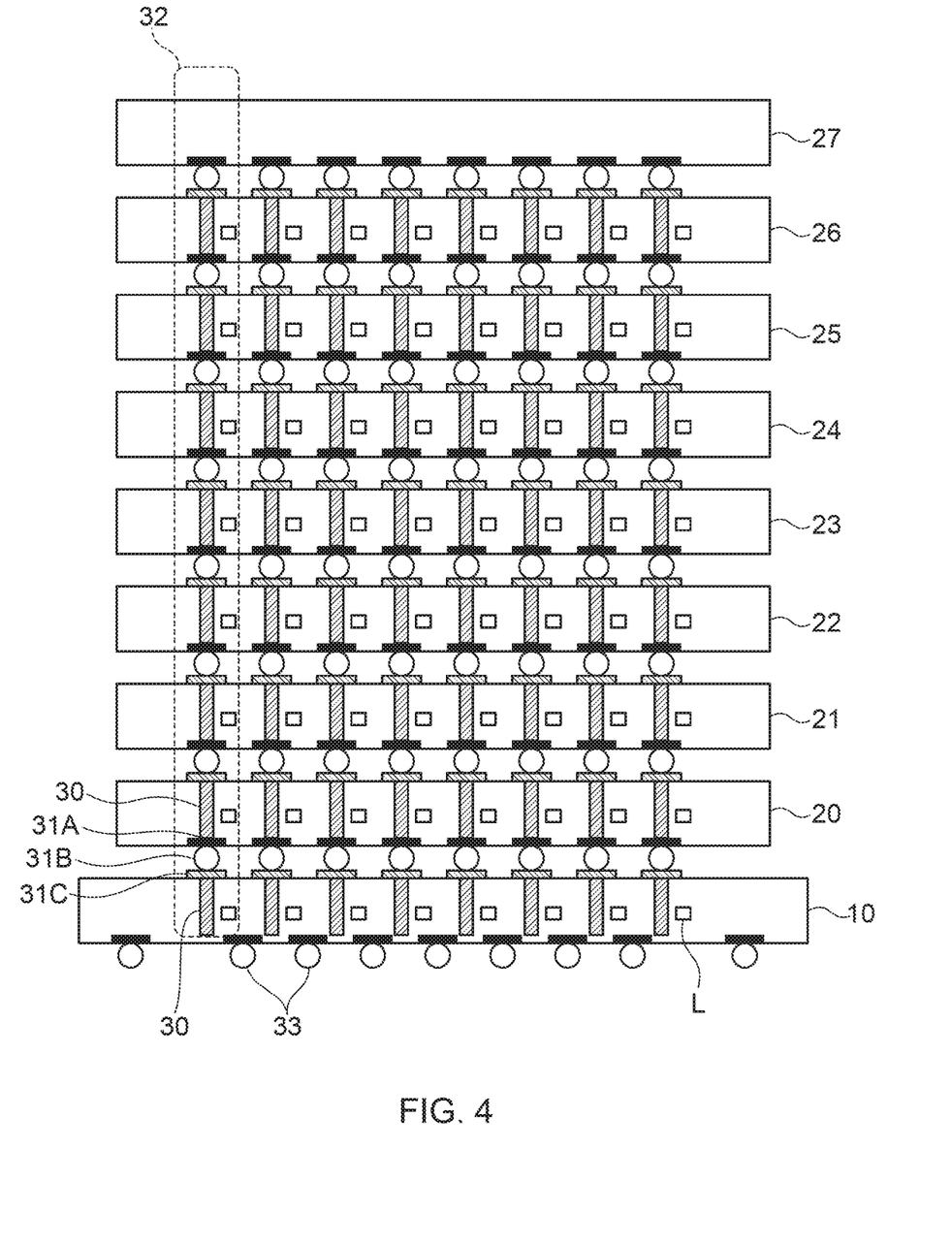
FIG. 4 is a schematic diagram for explaining a configuration of a signal path including a plurality of TSVs.

As shown in FIG. 4, each of the interface chip 10 and the memory core chips 20 to 26 includes a plurality of TSVs 30 provided to penetrate through the corresponding semiconductor substrate. The interface chip 10 and the memory core chips 20 to 27 are all stacked by a face-down method, that is, in such a manner that principal surfaces on which transistors and wiring patterns (all not shown) are formed face downward. Accordingly, the memory core chip 27 located in the topmost layer does not need the TSVs 30. However, the memory core chip 27 located in the topmost layer may include the TSVs 30. Most of the TSVs 30 provided on the memory core chips 20 to 26 are connected to front TSV pads 31A located at same planar positions, respectively. In contrast thereto, majorities of the TSVs 30 provided on the interface chip 10 and the front TSV pads 31A provided on the interface chip 10 are located at different planar positions. The TSVs 30 located at the same planar positions among the TSVs 30 provided on the interface chip 10 and the memory core chips 20 to 26 are respectively cascade connected via the front TSV pads 31A, TSV bumps 31B, and back TSV pads 31C, so that a plurality of signal paths 32 are formed. Commands and write data output from the interface chip 10 are supplied to the memory core chips 20 to 27 via the signal paths 32. Read data output from the memory core chips 20 to 27 are supplied to the interface chip 10 via the signal paths 32. External terminals 33 are provided on the interface chip 10 and transmission/reception of signals to/from an external circuit is performed via the external terminals 33.

Some of the signal paths 32 are spare signal paths. The spare signal paths are used when a certain signal path 32 has a defect. As shown in FIG. 4, latch circuits L are assigned to the TSVs, respectively, and fail information is stored in latch circuits L corresponding to respective TSVs 30 in a defective signal path 32.

Figure 5:
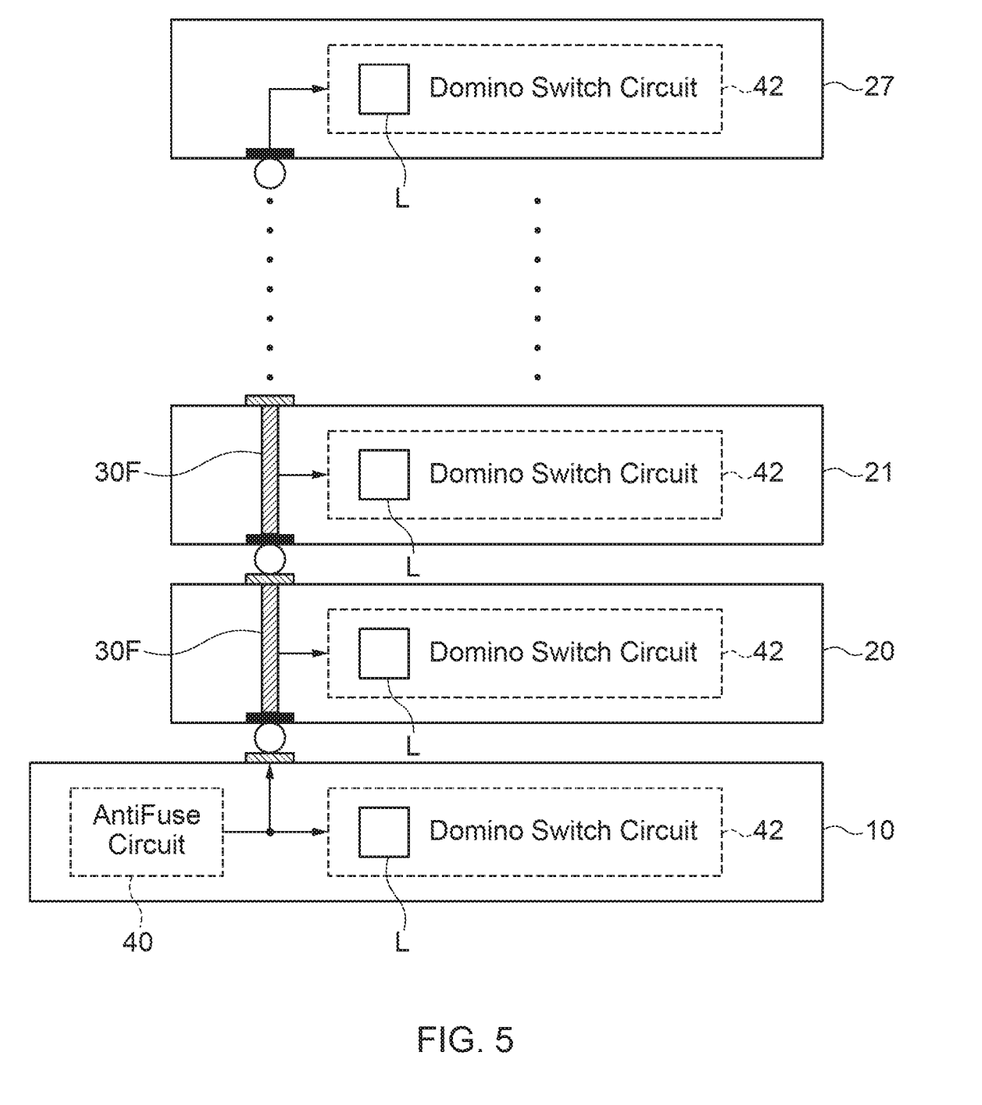
FIG. 5 is a schematic diagram for explaining a state where fail information is loaded into a domino switch circuit of each of the chips.

When the fail information is stored in the latch circuits L, connection relations between an internal circuit of the interface chip 10 and internal circuits of the memory core chips 20 to 27, and the TSVs 30 are switched, so that a spare signal path is used instead of the defective signal path. As shown in FIG. 5, a domino switch circuit 42 is provided in each of the interface chip 10 and the memory core chips 20 to 27. The domino switch circuits 42 are circuits for switching the connection relations between the internal circuit of the interface chip 10 and the internal circuits of the memory core chips 20 to 27, and the TSVs 30 and the connection relations between the internal circuit of the interface chip 10 and the internal circuits of the memory core chips 20 to 27, and the TSVs 30 are switched on the basis of the fail information stored in the latch circuits L. The fail information is first read from an antifuse circuit 40 during an initialization period after power activation and is loaded in common into the latch circuits L of the interface chip 10 and the memory core chips 20 to 27. Transfer of the fail information is performed through TSVs 30F for fail information transfer. Writing of the fail information to the antifuse circuit 40 is performed on the basis of a result of a screening test performed at the manufacturing stage.

Figure 6A:
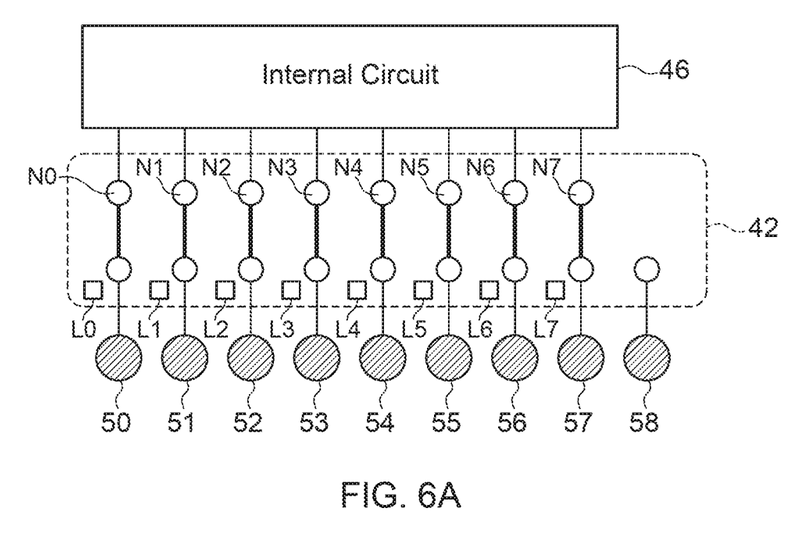
FIG. 6A is a schematic diagram for explaining a connection relation in a state where replacement by the domino switch circuit is not performed.
Figure 6B:
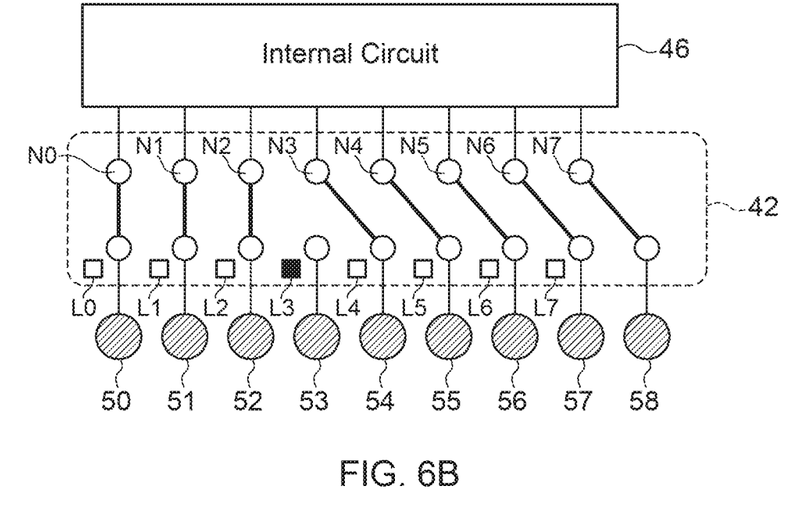
FIG. 6B is a schematic diagram for explaining a connection relation in a state where replacement by the domino switch circuit is performed.

As shown in FIG. 6A, each of the domino switch circuits 42 is connected between a plurality of input/output nodes of an internal circuit 46 and a plurality of the TSVs 30. In an example shown in FIG. 6A, the internal circuit 46 has eight input/output nodes N0 to N7 and nine TSVs 50 to 58 are assigned correspondingly thereto. Among these TSVs, eight TSVs 50 to 57 are original TSVs and one TSV 58 is a spare TSV. Corresponding latch circuits L0 to L7 are respectively assigned to the TSVs 50 to 57. In the example shown in FIG. 6A, the fail information is not stored in the latch circuits L0 to L7. In this case, the domino switch circuit 42 connects the input/output nodes N0 to N7 and the TSVs 50 to 57, respectively. Therefore, the spare TSV 58 is not used in this case. In contrast thereto, when the fail information is stored in, for example, the latch circuit 13 as shown in FIG. 6B, the domino switch circuit 42 connects the input/output nodes N0 to N7 and the TSVs 50 to 52 and 54 to 58, respectively. Accordingly, the TSV 53 corresponding to the latch circuit L3 is invalidated. In this way, the domino switch circuits 42 achieve recovery of a defect by shifting the connection relation between the input/output nodes N0 to N7 and the TSVs 50 to 58, without simply replacing a TSV to which the fail information is assigned with the spare TSV.

Fail information generated by an operation test performed during the initialization period after power activation may be also overwritten to the latch circuits L, as well as the fail information in the antifuse circuit 40 is loaded thereinto. An operation to overwrite the fail information by the operation test performed during the initialization period is called "auto repair operation". A defect on the signal path is found in a screening test performed at the manufacturing stage and the fail information is written to the antifuse circuit 40 on the basis thereof. Accordingly, a signal path including a defect is replaced by a spare signal path. However, there are rare cases where a defective signal path newly emerges with temporal changes after shipment. An operation to find such a defect emerging afterward and replace a defective signal path with a spare signal path is the auto repair operation.

Figure 7A:
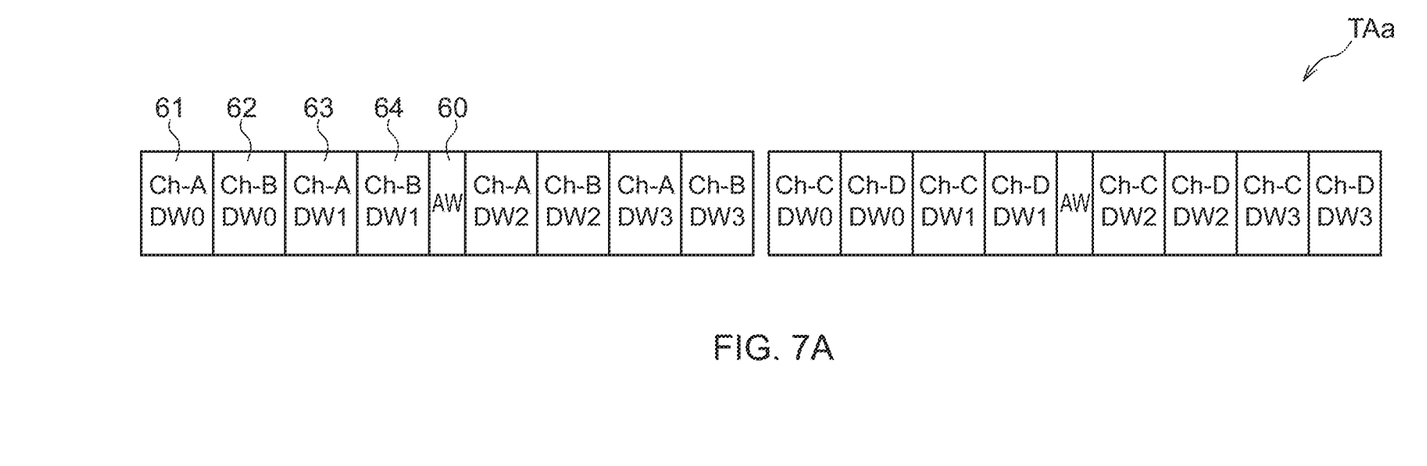
FIGS. 7A and 7B are schematic diagrams for explaining assignment of TSVs in a TSV area.
Figure 7B:
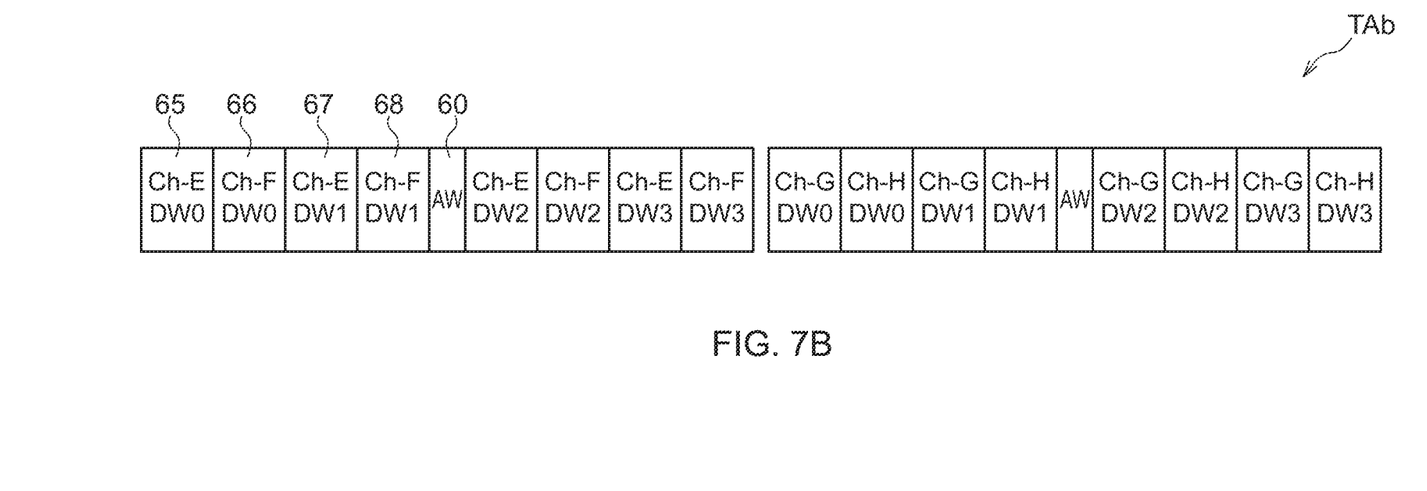

In the TSV areas TAa and TAb shown in FIG. 1, a plurality of TSVs penetrating through the semiconductor substrate are arranged. The TSVs arranged in the TSV area TAa and TAb are assigned as shown in FIGS. 7A and 7B, respectively. As shown in FIGS. 7A and 7B, the TSV area TAa and TAb include regions 61 to 68 where TSVs for I/O data are arranged, and a region 60 where TSVs to be used for transfer of addresses and commands are arranged. In an example shown in FIG. 7A, TSVs assigned to the group DW0 of the channel Ch-A are arranged in the region 61, TSVs assigned to the group DW0 of the channel Ch-B are arranged in the region 62, TSVs assigned to the group DW1 of the channel Ch-A are arranged in the region 63, and TSVs assigned to the group DW1 of the channel Ch-B are arranged in the region 64. As explained with reference to FIG. 3, the channel Ch-A and the channel Ch-B are assigned to different memory core chips, and the group DW0 and the group DW1 are assigned to different memory core chips, respectively. Accordingly, only one of the regions 61 to 64 is connected to the internal circuit in each of the memory core chips and the other three regions are bypassed. The same holds for the regions 65 to 68 arranged in the TSV area TAb.

Figure 8:
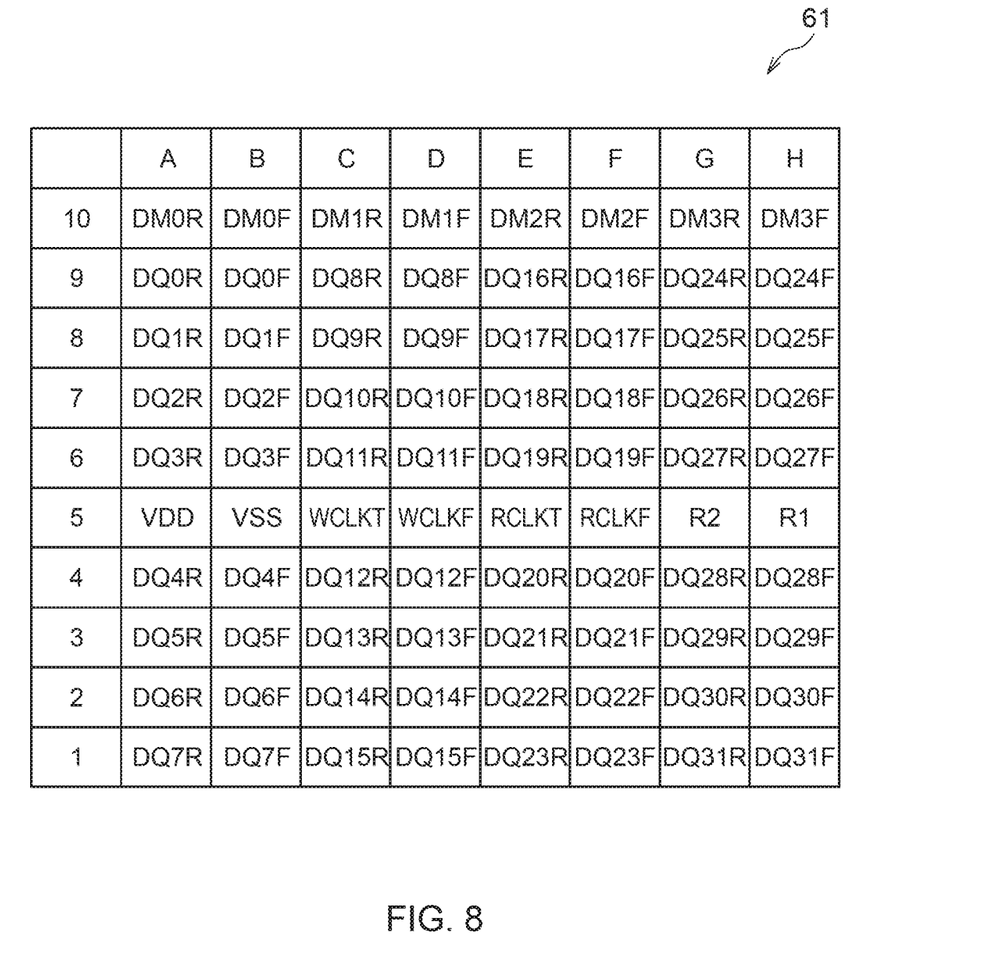
FIG. 8 is a schematic plan view showing a layout of the TSVs arranged in a region of the TSV area.

FIG. 8 is a table showing a layout of the TSVs arranged in the region 61. As shown in FIG. 8, the TSVs arranged in the region 61 include 32 via conductors corresponding to data DQ0R to DQ31R, respectively, and 32 via conductors corresponding to data DQ0F to DQ31F, respectively. The data DQ0R to DQ31R are 32-bit data simultaneously input/output in synchronization with a rising edge of a clock signal, and the data DQ0F to DQ31F are 32-bit data simultaneously input/output in synchronization with a falling edge of the clock signal. Further, TSVs corresponding to data mask signals DM0R to DM3R and DM0F to DM3F, TSVs corresponding to read clock signals RCLKT and RCLKF, TSVs corresponding to write clock signals WCLKT and WCLKF, TSVs corresponding to spare signal paths R1 and R2, and TSVs for power sources VDD and VSS are also included in the region 61. In an example shown in FIG. 8, paired data, for example, the data DQ0R and the data DQ0F are arranged adjacently to each other. The spare signal path R1 is assigned to the data DQ0R to DQ31R and DQ0F to DQ31F and the data mask signals DM0R to DM3R and DM0F to DM3F. The spare signal path R2 is assigned to the TSVs corresponding to the read clock signals RCLKT and RCLKF and the TSVs corresponding to the write clock signals WCLKT and WCLKF.

Figure 9:
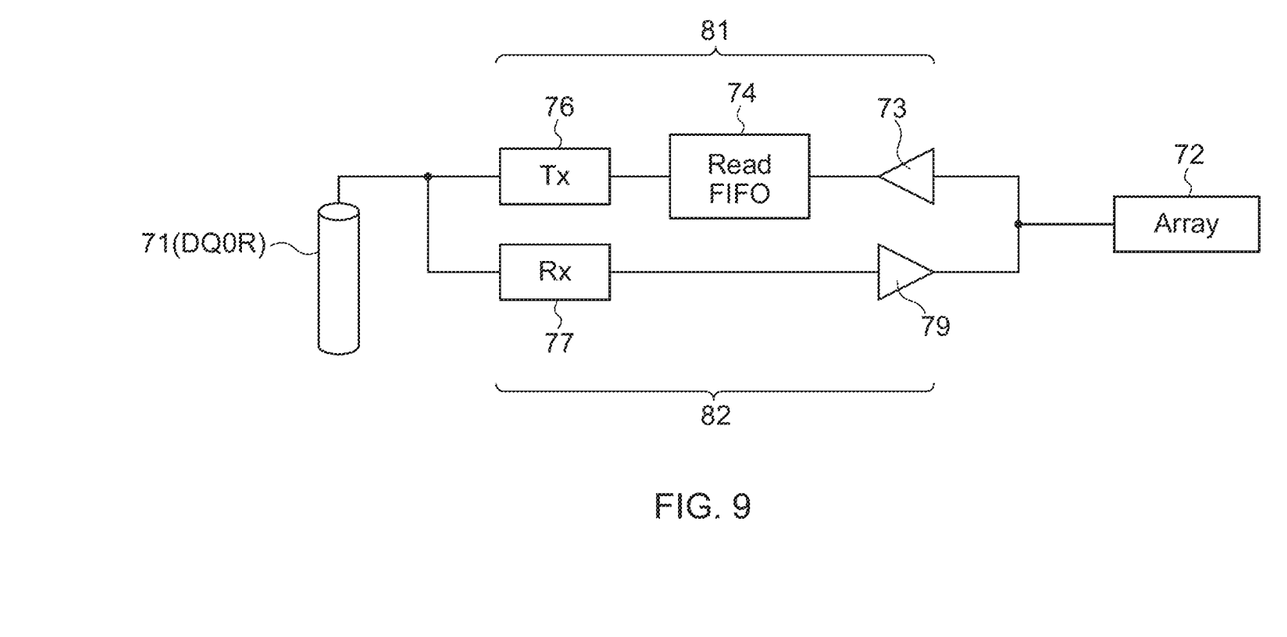
FIG. 9 is block diagram showing a circuit connected between the TSVs and a memory cell array.

FIG. 9 is a circuit diagram showing an example of a connection relation between TSVs and a memory cell array. In the example shown in FIG. 9, a read path 81 including an internal buffer 73, a read FIFO circuit 74, and an output buffer 76, and a write path 82 including an input receiver 77 and an internal buffer 79 are connected in parallel between a TSV 71 corresponding to the data DQ0R and a memory cell array 72. At the time of a normal operation, the read path 81 is activated in a read operation and the write path 82 is activated in a write operation. That is, the read path 81 and the write path 82 are mutually exclusively activated at the time of a normal operation. In contrast thereto, both the read path 81 and the write path 82 can be activated at the time of a test operation.

Figure 10:
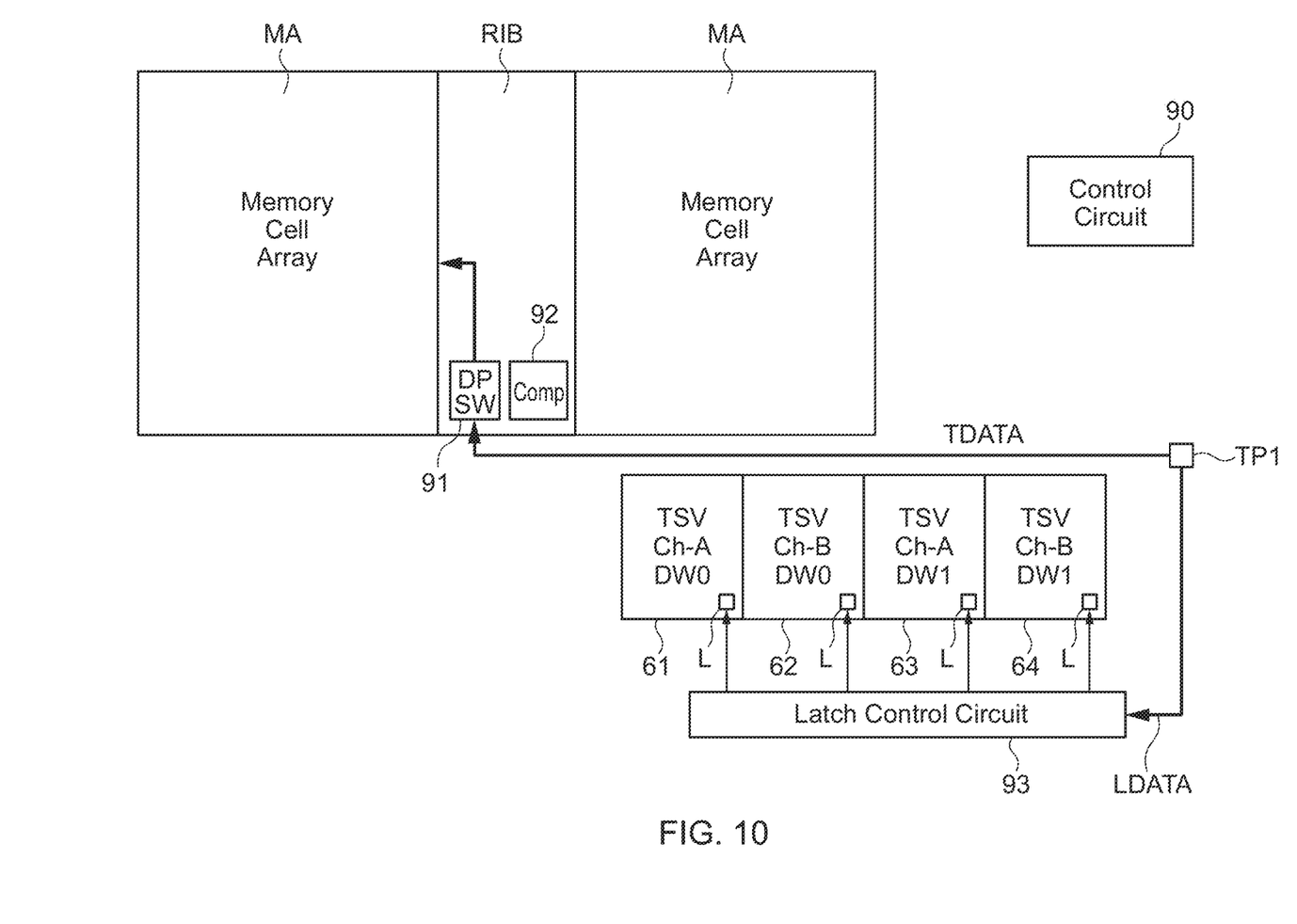
FIGS. 10 to 12 are schematic diagrams for explaining a flow of a test data in a test operation.
Figure 11:
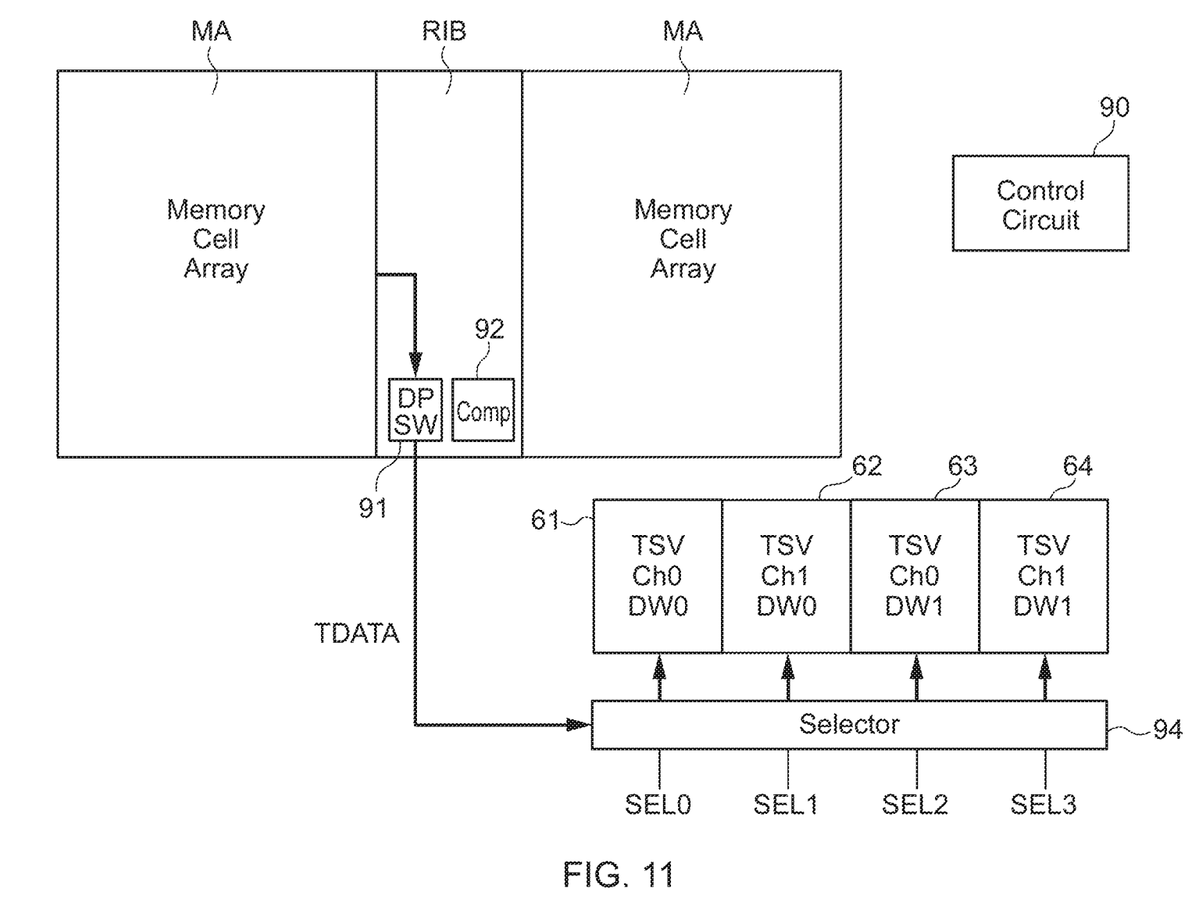
Figure 12:
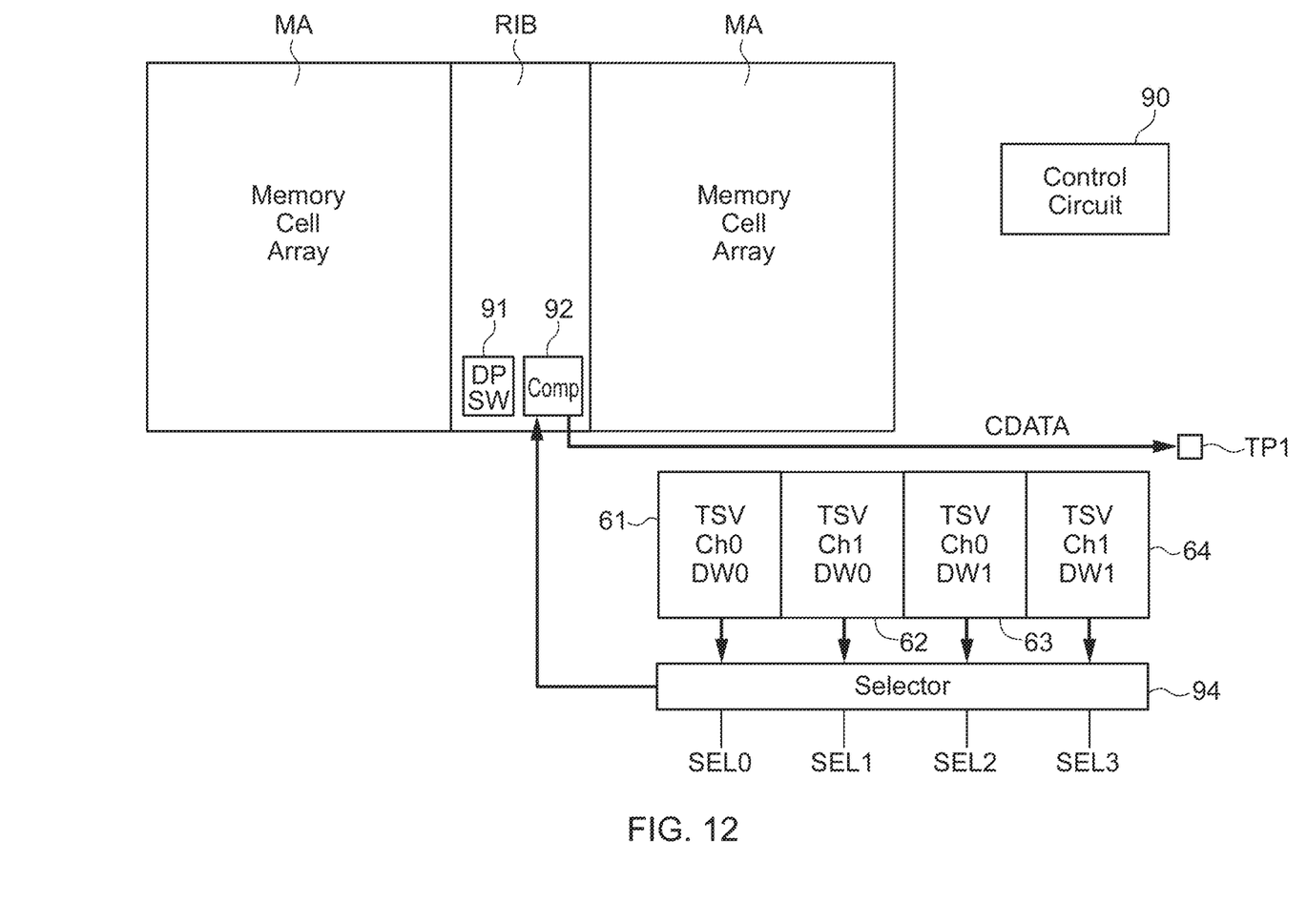

FIGS. 10 to 12 are schematic diagrams for explaining a flow of a test data in a test operation. The test operation shown in FIGS. 10 to 12 is performed under control by a control circuit 90 included in the memory core chips 20 to 27, and transmission/reception of a data to/from a tester is performed through a test pad TP1. Therefore, the test operation can be performed in a wafer state before stacking of the memory core chips 20 to 27.

In the test operation, a test data TDATA is first input from the test pad TP1 as shown in FIG. 10. The test data TDATA is written to the memory cell array MA via a switch circuit 91 included in the peripheral circuit RIB. At this time, a latch signal LDATA may be input via the test pad TP1. The latch signal LDATA is supplied to a latch control circuit 93 and accordingly fail information is written to any of the latch circuits L respectively assigned to the TSVs. It is alternatively possible to test paths assigned to regular TSVs without writing fail information to the latch circuits L in a first test and thereafter test a path assigned to a spare TSV by writing fail information to any of the latch circuits L.

Next, the test data TDATA written to the memory cell army MA is read out as shown in FIG. 11. The test data TDATA read from the memory cell array MA is transferred to a selector 94 via the switch circuit 91. The selector 94 is a circuit for switching the connection relation between the memory cell array MA and the regions 61 to 64 and selection thereby is performed on the basis of selection signals SEL0 to SEL3. For example, when the selection signal SEL0 is activated, the test data TDATA read from the memory cell array MA is supplied to the region 61. In this case, the regions 62 to 64 are separated from the memory cell array MA. In this way, the test data TDATA read from the memory cell array MA can be supplied to any of the regions 61 to 64 using the selection signals SEL0 to SEL3. This selection is enabled because which one of the regions 61 to 64 is to be connected to the memory cell army MA is undetermined in a wafer state while only one of the regions 61 to 64 is connected to the memory cell array MA and the other three regions are bypassed in a practical use.

When the test data TDATA is supplied to, for example, the region 61, the test data TDATA is supplied to each of corresponding TSVs via the read path 81 shown in FIG. 9. As described above, both the read path 81 and the write path 82 are activated at the time of a test operation. Therefore, the test data TDATA supplied to the TSVs via the read path 81 is returned to the switch circuit 91 via the write path 82 as shown in FIG. 12. That is, the test data TDATA read from the memory cell array MA pass through the read path 81, the TSVs, and the write path 82. To prevent the test data TDATA supplied to the read path 81 and the test data TDATA output from the write path 82 from colliding on a read/write bus, it suffices to delay the timing of supplying a clock signal to the read FIFO circuit 72 to delay the output timing of the test data TDATA output from the write path 82. The test data TDATA transferred to the switch circuit 91 is supplied to a compression circuit 92. The compression circuit 92 compresses the test data TDATA to generate a compression data CDATA. The compression data CDATA is information indicating whether the test data TDATA includes an error. The compression data CDATA is output from the test pad TP1 to outside.

As described above, in the present embodiment, not only a write operation and a read operation of the test data TDATA are performed to the memory cell array MA but also the test data TDATA read from the memory cell array MA is supplied to the compression circuit 92 via the read path 81 and the write path 82 at the time of a test operation. Therefore, whether the read path 81 and the write path 82 operate normally can be tested in a wafer state. Furthermore, because the latch signal LDATA can be input via the test pad TP1, whether the read path 81 and the write path 82 corresponding to a spare signal path operate normally can be also tested in a wafer state.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
a memory cell array;
a plurality of TSVs penetrating a semiconductor chip;
an output circuit configured to output a data to the TSVs;
an input circuit configured to receive a data from the TSVs;
a pad supplied with a test data from outside; and a control circuit configured to write the test data to the memory cell array, read the test data from the memory cell array, and transfer the test data from the memory cell array to the input circuit via the output circuit.

2. The apparatus as claimed in claim 1, wherein the pad is formed on the semiconductor chip without penetrating therethrough.

3. The apparatus as claimed in claim 2, wherein the pad is greater in a planar size than the TSVs.

4. The apparatus as claimed in claim 1, further comprising a compression circuit configured to generate a compression data based on the data supplied from the input circuit and output the compression data to the pad.

5. The apparatus as claimed in claim 1,
wherein the control circuit includes a select circuit,
wherein the plurality of TSVs include first and second TSVs, and
wherein the select circuit selects one of the first and second TSVs to be supplied with the data based on a selection signal.

6. The apparatus as claimed in claim 5, wherein the first and second TSVs are assigned to first and second channels, respectively, thereby one of the first and second TSVs is disconnected from the memory cell array when the control circuit is deactivated.

7. The apparatus as claimed in claim 6,
wherein the plurality of TSVs further include a third TSV,
wherein the select circuit selects one of the first, second and third TSVs to be supplied with the data based on the selection signal,
wherein the third TSV is assigned to the first channel, and
wherein the first and third TSVs are assigned to first and second groups, respectively, thereby one of the first and third TSVs is disconnected from the memory cell array when the control circuit is deactivated.

8. The apparatus as claimed in claim 1,
wherein the plurality of TSVs include regular TSVs and a spare TSV, and
wherein the control circuit is configured to transfer the data from the memory cell array to the input circuit via the output circuit and the spare TSV when a fail flag is activated.

9. The apparatus as claimed in claim 8, wherein the pad is supplied with a control signal from outside that activates the fail flag.

10. An apparatus comprising:
an interface chip: and
a core chip stacked over the interface chip, the core chip including a memory cell array, a pad, a control circuit, a plurality of TSVs coupled to the interface chip, respectively, and a plurality of data buffers coupled to the plurality of TSVs, respectively, and each of the data buffers including a data receiver and a data transmitter coupled in parallel;
wherein the control circuit is configured to transmit memory data read out from the memory cell array to the pad via the data transmitter and the data receiver of a selected one of the plurality of data buffers.

11. The apparatus of claim 10, wherein the control circuit is configured to transmit the memory data read out from the memory cell array to the pad via the data transmitter and the data receiver of the selected one of the plurality of data buffers in a test operation mode;
wherein the control circuit is configured to transmit memory data read out from the memory cell array via the data transmitter in a read operation mode; and
wherein the control circuit is configured to transmit memory data to the memory cell array via the data receiver in a write operation mode.

12. The apparatus of claim 11,
wherein the plurality of data buffers includes a first data buffer and a plurality of second data buffers,
wherein the control circuit is configured to transmit memory data read out from the memory cell array to the interface chip via the data transmitter of the first data buffer in the read operation mode,
wherein the control circuit is configured to transmit memory data from the interface chip to the memory cell array via the data receiver of the first data buffer in the write operation mode, and
wherein the plurality of second data buffers is deactivated in the read operation mode and the write operation mode.

13. The apparatus of claim 12, wherein the interface chip is configured to deactivate the plurality of second data buffers in the read operation mode and the write operation mode.

14. The apparatus of claim 13, wherein the control circuit is configured to successively select the data buffers.

15. A method for testing an apparatus having a memory cell array, a plurality of TSVs, input and output circuits connected in parallel between the memory cell array and the TSVs, and a test pad, the method comprising:
inputting a test data to the test pad;
writing the test data to the memory cell array;
reading the test data from the memory cell array; and
transferring the test data from the memory cell array to the input circuit via the output circuit and the TSVs.

16. The method of claim 15, further comprising compressing the test data supplied from the input circuit to generate a compression data.

17. The method of claim 16, further comprising outputting the compression data to the test pad.

18. The method of claim 15,
wherein the plurality of TSVs includes a plurality of regular TSVs and a spare TSV, and
wherein the method further comprises invalidating one of the regular TSVs and validating the spare TSV during the transferring.

19. The method of claim 18, wherein the invalidating is performed by setting a fail flag to one of latch circuits corresponding to the one of the regular TSVs.

20. The method of claim 19, wherein the setting the fail flag is performed by inputting a control signal via the test pad from outside.

* * * * *